(12) United States Patent
Hwang et al.

(10) Patent No.: US 12,256,625 B2
(45) Date of Patent: Mar. 18, 2025

(54) MANUFACTURING APPARATUS AND MANUFACTURING METHOD OF DISPLAY DEVICE

(71) Applicant: Samsung Display Co., LTD., Yongin-si (KR)

(72) Inventors: Dae Hyun Hwang, Seoul (KR); Do Hyung Ryu, Yongin-si (KR); Wu Hyeon Jung, Seoul (KR); Yong Seong Jang, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/731,223

(22) Filed: Apr. 27, 2022

(65) Prior Publication Data

US 2023/0009706 A1   Jan. 12, 2023

(30) Foreign Application Priority Data

Jul. 12, 2021   (KR) .......................... 10-2021-0091082

(51) Int. Cl.
| | |
|---|---|
| *H10K 71/00* | (2023.01) |
| *B32B 37/10* | (2006.01) |
| *B32B 38/18* | (2006.01) |
| *H05K 1/18* | (2006.01) |
| *H10K 50/84* | (2023.01) |
| *H10K 59/12* | (2023.01) |
| *H10K 59/122* | (2023.01) |

(52) U.S. Cl.
CPC .............. *H10K 71/00* (2023.02); *B32B 37/10* (2013.01); *B32B 38/1858* (2013.01); *B32B 2457/20* (2013.01); *H05K 1/189* (2013.01); *H05K 2201/10128* (2013.01); *H10K 50/841* (2023.02); *H10K 59/1201* (2023.02); *H10K 59/122* (2023.02)

(58) Field of Classification Search
None
See application file for complete search history.

(56) References Cited

U.S. PATENT DOCUMENTS

2016/0318293 A1* 11/2016 Kim .................... B32B 38/1841
2020/0203672 A1*  6/2020 Kuon ................... H10K 50/8426
2021/0323293 A1   10/2021 Kim et al.

FOREIGN PATENT DOCUMENTS

| KR | 10-2011-0007515 | 1/2011 |
| KR | 10-1005859 | 1/2011 |
| KR | 20190015741 A * | 2/2019 |

(Continued)

OTHER PUBLICATIONS

KR20190015741A_machine_translation (Year: 2019).*

*Primary Examiner* — Michael N Orlando
*Assistant Examiner* — Abhishek A Patwardhan
(74) *Attorney, Agent, or Firm* — CANTOR COLBURN LLP

(57) ABSTRACT

A apparatus for manufacturing a display device includes: a stage for supporting a display module including a display panel, a cover window, and a flexible printed circuit board; and an adsorption unit disposed at one side of the stage, the adsorption unit configured to be moved in a horizontal direction such that a distance between the stage and the adsorption unit is adjusted, wherein the adsorption unit is configured to adsorb and support the flexible printed circuit board connected to the display panel.

18 Claims, 16 Drawing Sheets

(56) References Cited

FOREIGN PATENT DOCUMENTS

| KR | 10-2117265 | 6/2020 |
| KR | 10-2020-0078243 | 7/2020 |
| KR | 10-2233336 | 3/2021 |
| KR | 10-2021-0130068 | 10/2021 |

* cited by examiner

MANUFACTURING APPARATUS AND MANUFACTURING METHOD OF DISPLAY DEVICE

CROSS REFERENCE TO RELATED APPLICATION

This application claims priority from and the benefit of Korean Patent Application No. 10-2021-0091082, filed on Jul. 12, 2021, which is hereby incorporated by reference for all purposes as if fully set forth herein.

BACKGROUND

Field

Embodiments of the invention relate generally to a manufacturing method of a display device and, more specifically, to a manufacturing apparatus and a manufacturing method for attaching a cover panel to a rear surface of a display panel bonded to a cover window in a manufacturing process of a display device.

DISCUSSION OF THE BACKGROUND

A display device is used to display an image in various electronic devices, such as a mobile phone, a tablet, a wearable device, a laptop computer, a television, and a monitor. Generally, a quadrangular display device is used, but various types of display devices other than the quadrangular display device are being developed. For example, a display device having a circular shape has been used in an electronic device such as a watch or a smart watch.

In manufacturing of a circular shaped display device, when a cover window has a curved shape, it may be difficult to reliably attach a cover panel by using a conventional method such as a roll bonding method.

The above information disclosed in this Background section is only for understanding of the background of the inventive concepts, and, therefore, it may contain information that does not constitute prior art.

SUMMARY

Apparatuses for manufacturing a display device constructed according to the principles of the invention are capable of improving quality and reliability of attachment between a cover panel and a display panel of a display device with a cover window having a curved shape.

Methods for manufacturing the display device according to the principles of the invention are capable of improving the quality and the reliability of the attachment between the cover panel and the display panel of the display device with the cover window having a curved shape.

According to the apparatuses and the methods for manufacturing the display device according to the principles of the invention, it is possible to accurately attach a cover panel to a rear surface of a display panel bonded to the cover window having a three-dimensional shape, without generating air bubbles and without damaging a display device.

Additional features of the inventive concepts will be set forth in the description which follows, and in part will be apparent from the description, or may be learned by practice of the inventive concepts.

According to an aspect of the invention, an apparatus for manufacturing a display device includes: a stage for supporting a display module including a display panel, a cover window, and a flexible printed circuit board; and an adsorption unit disposed at one side of the stage, the adsorption unit configured to be moved in a horizontal direction such that a distance between the stage and the adsorption unit is adjusted, wherein the adsorption unit is configured to adsorb and support the flexible printed circuit board connected to the display panel.

The adsorption unit may be configured to move away from the stage before the display module is loaded on the stage, and to move closer to the stage to adsorb and support the flexible printed circuit board after the display module is loaded on the stage.

The adsorption unit may include an adsorption head configured to vacuum-adsorb the flexible printed circuit board, and a support member supporting the adsorption head. The adsorption head may protrude from the support member toward the stage.

The support member may include a first support member and a second support member coupled to the first support member to be vertically movable, and the adsorption head may be coupled to the second support member.

The cover window may include a front portion and a side portion; and the adsorption unit may be configured to adsorb and support the flexible printed circuit board such that an angle between the flexible printed circuit board and the front portion of the cover window may be 90° or more.

The apparatus for manufacturing the display device may further include a peeling head configured to adsorb the cover panel for alignment of the cover panel with respect to the display panel. The peeling head may include a first portion having a first diameter, and a second portion protruding from the first portion, the second portion of the peeling head having a second diameter smaller than the first diameter of the first portion of the peeling head.

The peeling head may further include an adsorption pad coupled to the second portion of the peeling head, the adsorption pad including an opening for vacuum adsorption of the cover panel.

The first portion and the second portion of the peeling head may be integrally formed.

The apparatus for manufacturing the display device may further include a pressing pad configured to attach the cover panel to the display panel in a face-to-face manner. The pressing pad may include a body portion, and an elastic portion coupled to the body portion, the elastic portion having a thickness smaller than that of the body portion.

The pressing pad may have a cylinder shape having a flat side surface and a circular side surface.

When the cover panel is attached to the display panel, the flat side surface of the pressing pad may face the flexible printed circuit board.

Before the pressing pad presses the cover panel, a distance between an edge of the display panel adjacent to the flexible printed circuit board and the flat side surface of the pressing pad may be about 0.5 mm or more.

According to another aspect of the invention, a method for manufacturing a display device includes the steps of: reversely moving an adsorption unit disposed at one side of a stage to be away from the stage; loading a display module into a mounting portion of the stage, the display module including a display panel, a cover window, and a flexible printed circuit board; moving the adsorption unit to be closer to the stage; and adsorbing and supporting the flexible printed circuit board connected to the display panel by the adsorption unit.

The method for manufacturing the display device may further include the step of aligning a cover panel with respect to the display panel in a state that the flexible printed circuit board is adsorbed and supported by the adsorption unit.

The method for manufacturing the display device may further include the step of contacting a portion of the cover panel to the display panel when the cover panel is aligned to the display panel.

The step of aligning of the cover panel may be performed by using a peeling head, and the peeling head may include a first portion, a second portion protruding from the first portion, and an adsorption pad coupled to the second portion. The first portion of the peeling head may have a diameter greater than that of the second portion of the peeling head The method for manufacturing the display device may further include the step of attaching the cover panel to the display panel in a state that the flexible printed circuit board is adsorbed and supported.

The cover panel may be attached to the display panel in a face-to-face manner by using a pressing pad.

The cover window may be adsorbed and supported by the mounting portion of the stage when the flexible printed circuit board is adsorbed and supported by the adsorption unit.

The cover window may include a front portion and a side portion, and the flexible printed circuit board may be adsorbed and supported by the adsorption unit such that an angle formed by the flexible printed circuit board and the front portion may be about 90° or more.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
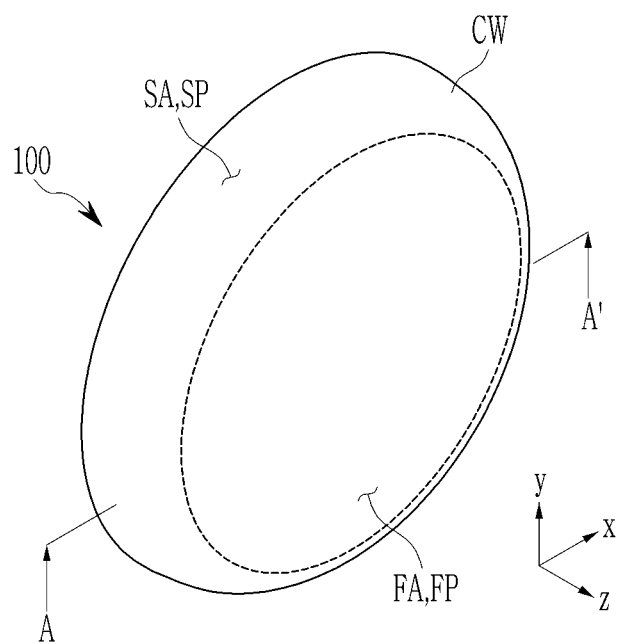
FIG. 1 is a schematic perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z-axes, and may be interpreted in a broader sense. For example, they may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
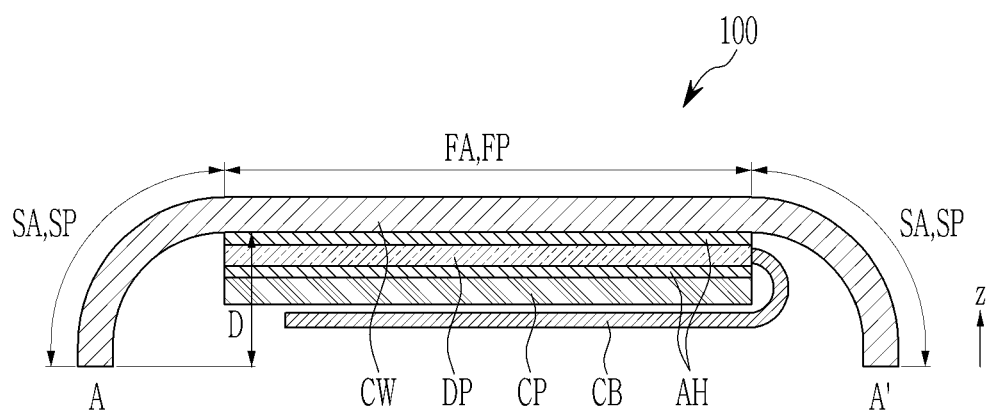
FIG. 2 is a schematic cross-sectional view taken along line A-A' in FIG. 1.

FIG. 1 illustrates a schematic perspective view of a display device according to an embodiment, and FIG. 2 illustrates a schematic cross-sectional view of the display device taken along line A-A' in FIG. 1.

Referring to FIGS. 1 and 2, a display device 100 may include a cover window CW, a display panel DP disposed on a rear surface of the cover window CW, a cover panel CP disposed on a rear surface of the display panel DP, and a flexible printed circuit board CB connected to the display panel DP. The display device 100 may be used to display an image in an electronic device such as a watch, a smart watch, a mobile device, a wearable device, or the like.

The display device 100 may include a front area FA and a side area SA as a whole. The side area SA may extend from the front area FA and surround the front area FA. In an embodiment, the front area FA may be planar. In another embodiment, at least a portion of the front area FA may be curved. The side area SA may have a circular shape or a ring-like shape in a plan view. For example, the side area SA may have a curved surface. All of the front area FA of the display device 100 may form a screen for displaying an image. The side area SA may not form a screen. Alternatively, at least a portion of the side area SA may form the screen. The screen may correspond to a display area of the display device 100 or the display panel DP. When the display device 100 is viewed from the front thereof, a user may recognize a circular screen, which is implemented in the front area FA or in both the front area FA and at least a portion of the side area SA.

In the display device 100, the cover window CW, the display panel DP, and the cover panel CP may be attached to each other. An adhesive film such as an optically clear adhesive (OCA) may be used for bonding the cover window CW and the display panel DP. For example, an adhesive layer AH including adhesive may be disposed between the cover window CW and the display panel DP. An adhesive film such as a pressure sensitive adhesive (PSA) may be used for attachment of the cover panel CP and the display panel DP. For example, an adhesive layer AH including adhesive may be disposed between the cover panel CP and the display panel DP.

The cover window CW may protect the display panel DP from the external environment and impact. The cover window CW may function as a support for maintaining the display panel DP in a predetermined state. The cover window CW may be made of a transparent and hard material such as glass or plastic so that an image displayed by the display panel DP may be transmitted through the cover window CW. In the cover window CW, at least an area corresponding to the screen may be optically transparent.

The cover window CW may form an overall appearance of the display device 100. In an electronic device to which the display device 100 is applied, the cover window CW may be exposed to the outside. The display panel DP, the cover panel CP, and the flexible printed circuit board CB may be positioned within a housing defined by the cover window CW and a set cover.

The cover window CW may define the front area FA and the side area SA of the display device 100. The cover window CW may include a front portion FP and a side portion SP respectively corresponding to the front area FA and the side area SA of the display device 100. The side portion SP may protrude from the front portion FP. The side portion SP may include a portion that is curved from the front portion FP at a preset curvature radius. The cover window CW may have a shape in which the front portion FP is concave from the side portion SP. The depth D of a concave portion (e.g., a depth D from an edge of the side portion SP to an inner surface of the front portion FP) may be about 2 mm or more, about 3 mm or more, or about 4 mm or more.

The display panel DP may be a light emitting display panel including light emitting elements such as light emitting diodes. The display panel DP may be a touch screen panel capable of performing a touch sensing function. At least a portion of the display panel DP may be flexible. The display panel DP may include a display area corresponding to a screen on which an image is displayed, and a non-display area on which an image is not displayed. Pixels are arranged in the display area, and an image may be displayed by a combination of the pixels. The non-display area may be disposed at an edge of the display panel DP, and may be disposed around the display area. The non-display area is an area in which circuits and/or wires for generating and/or transmitting various signals applied to the display area are disposed. In the non-display area, a pad part including pads for receiving signals from the outside of the display panel DP or outputting signals to the outside of the display panel DP may be disposed. The flexible printed circuit board CB may be connected or bonded to the pad part.

The cover panel CP may protect the display panel DP from a rear environment (for example, from impact, electromagnetic waves, noise, etc.) of the display panel DP. The cover panel CP may diffuse heat generated by the display panel DP to the outside, and may prevent heat, which is generated by a processor, a battery, a memory, and the like that are disposed on the rear surface of the display panel DP in the electronic device, from being transmitted to the display panel DP. The cover panel CP may function as a protection sheet, a lower sheet, or the like.

The flexible printed circuit board CB may be connected to the pad part of the display panel DP to transmit signals for driving the display panel DP to the display panel DP. The flexible printed circuit board CB may be mounted with a driving integrated circuit chip that generates and/or processes signals for driving the display panel DP. The flexible printed circuit board CB may be bent so that at least a portion thereof is disposed on the rear surface of the cover panel CP.

The display panel DP and the cover panel CP may be disposed in a space defined by the cover window CW. The display panel DP and the cover panel CP may be completely accommodated in the concave portion of the cover window CW. Thus, the display panel DP and the cover panel CP may not be protruded from the side portion SP of the cover window CW. A distance from a rear surface of the front portion FP of the cover window CW to the rear surface of the cover panel CP may be smaller than the depth D of the concave portion. For example, the distance may be about ¾ or less, about ½ or less, or about ¼ or less of the depth D.

The cover panel CP may be attached to the display panel DP in a separate process after bonding the cover window CW and the display panel DP. Since the cover window CW has a circular shape in a plan view and the cover panel CP is disposed in the concave portion of the cover window CW, it is difficult to attach the cover panel CP by an attaching method such as a roll bonding method.

A method of manufacturing the display device according to an embodiment, particularly a method of attaching the cover panel CP to the display panel DP, will now be described in detail.

Figure 3:
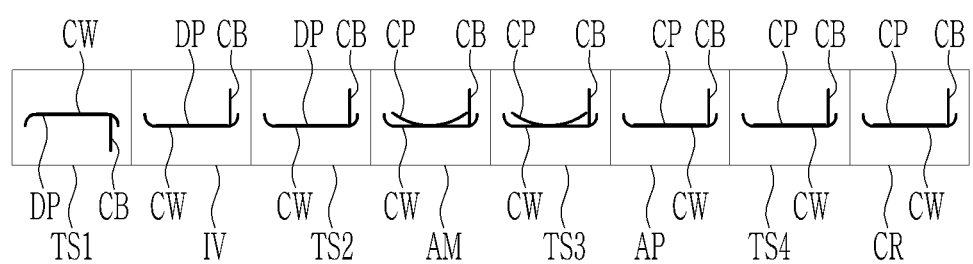
FIG. 3 is a schematic view of an embodiment of a manufacturing apparatus for manufacturing the display device of FIG. 1 constructed according to the principles of the invention.

FIG. 3 schematically illustrates a manufacturing apparatus of the display device according to an embodiment.

Referring to FIG. 3, an apparatus or system for attaching the cover panel CP to the display panel DP is shown. The manufacturing apparatus may include a first transfer part TS1, an inversion part IV, a second transfer part TS2, an alignment part AM, a third transfer part TS3, an attachment part AP, a fourth transfer part TS4, and a curing part CR.

The first transfer part TS1 may load a module (hereinafter referred to as a display module) in which the cover window CW and the display panel DP are bonded to the inversion part IV. The display panel DP, which is connected to the flexible printed circuit board CB, may be bonded to the cover window CW. The first transfer part TS1 may pick up the display module from a cassette or a tray on which the display module is loaded so that the front surface of the cover window CW faces upwardly and the flexible printed circuit board CB faces downwardly. Further, the first transfer part TS1 may load the picked-up display module into the inversion part IV. In the manufacturing apparatus, the loading process and the unloading process may be performed by a loader and an unloader such as an articulated robot.

The display module loaded in the inversion part IV may be inverted so that the front surface of the cover window CW faces downwardly and the flexible printed circuit board CB faces upwardly. The inversion part IV may include an inversion jig that rotates about a rotation axis disposed in a horizontal direction to invert the display module.

The second transfer part TS2 may load the display module into the alignment part AM. The alignment part AM may align the cover panel CP to be attached to the rear surface of the display panel DP with respect to the display panel DP. The alignment part AM may include a vision aligning apparatus and an alignment stage. For example, the vision aligning apparatus may recognize alignment marks on materials (or elements) with a camera, may calculate errors of the materials (or elements) through image processing to calculate compensation data, and may control an alignment stage based on the compensation data. Accordingly, the display panel DP and the cover panel CP, which are materials (or elements) to be attached, may be accurately aligned.

The alignment part AM may remove a release paper of an adhesive film provided on the cover panel CP or the display panel DP, and may contact a portion (for example, a central portion) of the cover panel CP and a portion (for example, a central portion) of the display panel DP. Accordingly, a portion of the cover panel CP and a portion of the display panel DP may be attached (e.g., temporarily). When a portion of the cover panel CP is attached to the display panel DP, a relative position between the cover panel CP and the display panel DP may be fixed in an aligned state. To this end, the alignment part AM may include a peeling head capable of pressing while adsorbing (or holding) the cover panel CP. Attaching a central portion of the cover panel CP and a central portion of the display panel DP may be advantageous in preventing occurrence of defects (e.g., air bubbles) between the cover panel CP and the display panel DP in a subsequent attachment process. The alignment part AM may include a peeling device for removing the release paper. The alignment part AM may include a jig on which the peeling head is mounted, and a driving unit for moving the jig.

The third transfer part TS3 may transfer the display module, to which a portion of the cover panel CP is attached, from the alignment part AM to the attachment part AP. Through the transfer of the display module, a stage, on which the display module having the cover panel CP (which is aligned to the display module and partially attached to the display module) is loaded, may be moved to the attachment part AP from the alignment part AM. For example, during the transfer of the display module, the display module may be pulled out (or unloaded) from the alignment part AM to be loaded into the attachment part AP.

The attachment part AP may attach the cover panel CP to the display panel DP in a face-to-face manner by using a pad. In this case, the pad may have a shape capable of preventing interference with the flexible printed circuit board CB. The attachment part AP may include a device (or a unit) suitable for conventional bonding, for example, a jig on which a pad is mounted, a driving unit for moving the jig, and the like.

The fourth transfer part TS4 may draw out the display device 100, to which the cover panel CP is attached, from the attachment part AP to load the display device 100 into the curing part CR. The curing part CR may form the adhesive layer AH by curing the adhesive film interposed between the display panel DP and the cover panel CP.

After the cover panel CP is completely attached and cured, the above-described display device 100, in which the cover window CW and the display panel DP are bonded and the cover panel CP is attached to the rear surface of the display panel DP, may be manufactured.

Figure 4:
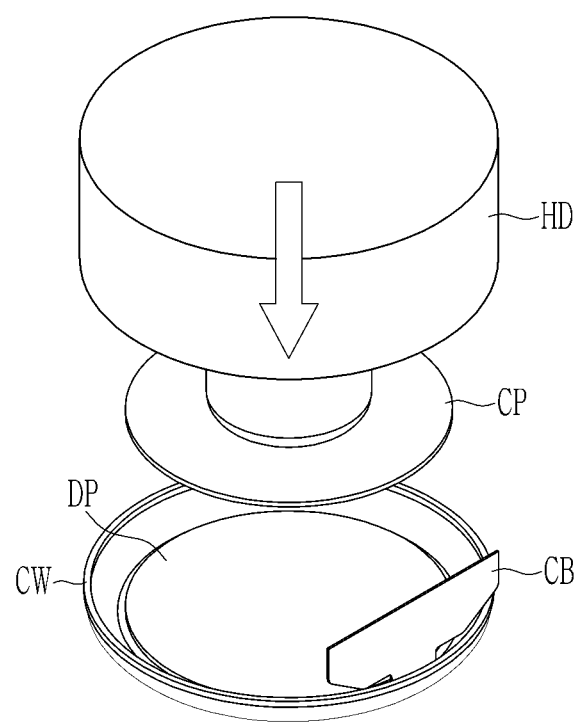
FIG. 4 is a schematic perspective view illustrating an alignment process of a cover panel according to an embodiment.
Figure 5:
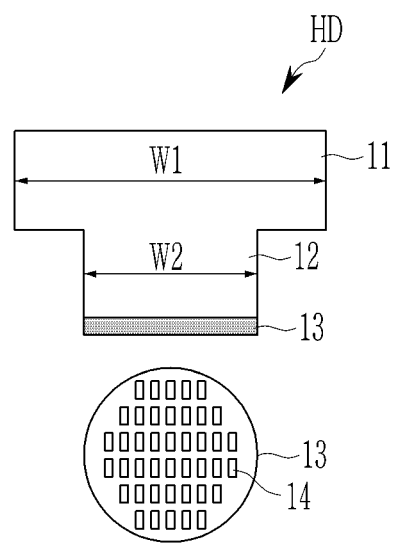
FIGS. 5 and 6 are schematic views illustrating embodiments of a peeling head used in the alignment process of the cover panel of FIG. 4, respectively.
Figure 6:
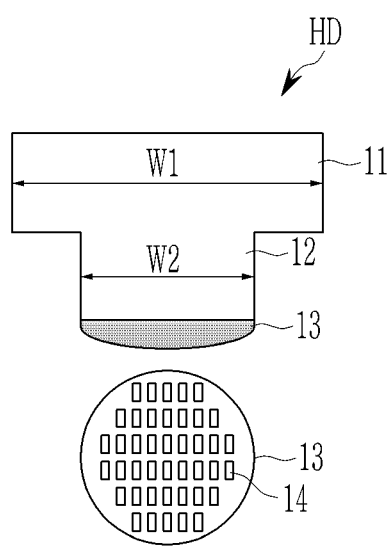
Figure 7:
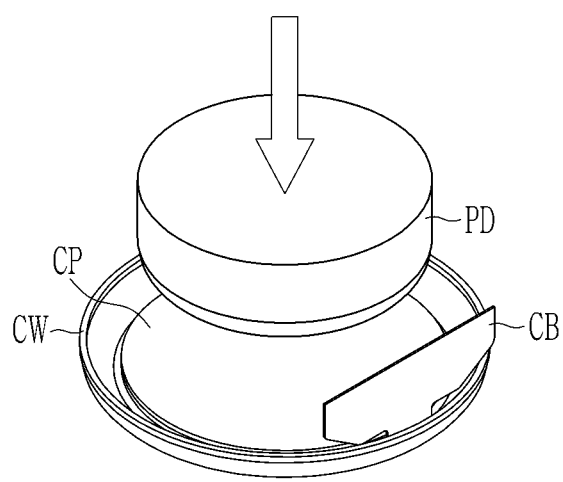
FIGS. 7, 8, 9, and 10 are schematic views respectively illustrating an attachment process of a cover panel according to an embodiment.

FIG. 4 illustrates an alignment process of a cover panel according to an embodiment, and FIGS. 5 and 6 schematically illustrate a peeling head used in an alignment process of a cover panel according to an embodiment, respectively. In FIGS. 5 and 6, lower drawings show lower surfaces of an adsorption pad (e.g., a suction pad) of the peeling head.

Referring to FIG. 4, an alignment process performed in the alignment part AM of the above-described manufacturing apparatus may be performed by using the peeling head HD having a predetermined structure. The cover panel CP and the display panel DP may be aligned in a state that the peeling head HD vacuum-adsorbs the cover panel CP. A contact area between the peeling head HD and the cover panel CP may be smaller than an area of the cover panel CP. Accordingly, only a portion of the cover panel CP may be in contact with (or attached to) the display panel DP when the peeling head HD moves (for example, descends) so that the cover panel CP comes into contact with the display panel DP.

Referring to FIGS. 4, 5, and 6, the peeling head HD may have an overall two-stage cylinder shape. The peeling head HD may include a first portion 11 having a relatively large diameter (e.g., a first diameter W1), a second portion 12 protruding downwardly from the first portion 11 and having a relatively small diameter (e.g., a second diameter W2), and an adsorption pad 13 coupled to the second portion 12. The first portion 11 of the peeling head HD may be a part mounted on a peeling head fixing part such as a jig. The first portion 11 and the second portion 12 of the peeling head HD may be integrally formed. The adsorption pad 13 is a part in contact with the cover panel CP, and may vacuum-adsorb the cover panel CP and press the cover panel CP. A diameter of the adsorption pad 13 may be substantially the same as that of the second portion 12. The adsorption pad 13 may include openings 14 for vacuum adsorption of the cover panel CP. The adsorption pad 13 may be attached to the second portion 12.

In order to prevent the cover panel CP from being damaged (for example, being scratched) or to prevent occurrence of air bubbles between the cover panel CP and the display panel DP when the cover panel CP is pressed, the adsorption pad 13 may be made of an elastic material such as a silicone resin, rubber, or elastomer. The adsorption pad 13 may have a thickness of about 0.5 mm to about 2 mm, for example, about 1 mm. To minimize an area in which the cover panel CP is pressed while stably adsorbing the cover panel CP, the diameter of the adsorption pad 13 must be about ⅔ or less or about ½ or less of that of the cover panel CP.

The adsorption pad 13 may be entirely flat, as shown in FIG. 5, or may be convex in a middle portion thereof, as shown in FIG. 6. The adsorption pad 13 with a flat lower surface may be advantageous for adsorption of the cover panel CP. The adsorption pad 13, which has a convex central portion, may be advantageous in minimizing a pressure area of the cover panel CP or in temporarily attaching the cover panel CP when the front portion FP of the cover window CW is curved.

FIGS. 7, 8, 9, and 10 respectively illustrate an attachment process of a cover panel according to an embodiment.

Referring to FIGS. 7, 8, 9, and 10, the attachment process performed in the attachment part AP of the manufacturing apparatus described above may be performed by using a pressing pad PD having a predetermined structure. The pressing pad PD may have an overall cylinder shape. The pressing pad PD may be mounted on a pressing pad fixing part (e.g., a jig) to be moved. When the pressing pad PD is lowered, a lower surface of the pressing pad PD may closely contact the cover panel CP, and thus the cover panel CP may be attached to the display panel DP in a face-to-face manner. The pressing pad PD may be made of an elastic material.

In consideration of elastic deformation of the pressing pad PD during pressing by the pressing pad PD, a diameter of the pressing pad PD may be determined. For example, the diameter of the pressing pad PD may be smaller than that of the cover panel CP. The pressing pad PD may be formed to have various hardnesses, radiuses of curvature of the lower surface, and thicknesses to prevent air bubbles from being trapped between the display panel DP and the cover panel CP. For example, the pressing pad PD may have shore hardness of about 40 to about 60. The pressing pad PD may have a thickness of about 5 mm to about 20 mm, or about 9 mm to about 18 mm.

When the cover panel CP is attached to the display panel DP, radial attachment of the cover panel CP, which is pressed from the central portion of the cover panel CP toward the peripheral portion of the cover panel CP, may be advantageous for air bubbles to escape without being trapped such that quality and reliability of the attachment between the cover panel CP and the display panel DP is improved and enhanced. To this end, a lower surface of the pressing pad PD may be curved with a predetermined curvature radius such that a central portion of the pressing pad PD is convex more than a peripheral portion of the pressing pad PD.

The pressing pad PD may be formed to have a predetermined thickness in consideration of elastic deformation thereof during pressing, but the pressing pad PD may interfere with the flexible printed circuit board CB when the pressing pad PD is elastically deformed. For example, the pressing pad PD may press the flexible printed circuit board CB while being radially spread, and thus the flexible printed circuit board CB may be damaged (for example, cracked).

Figure 8:
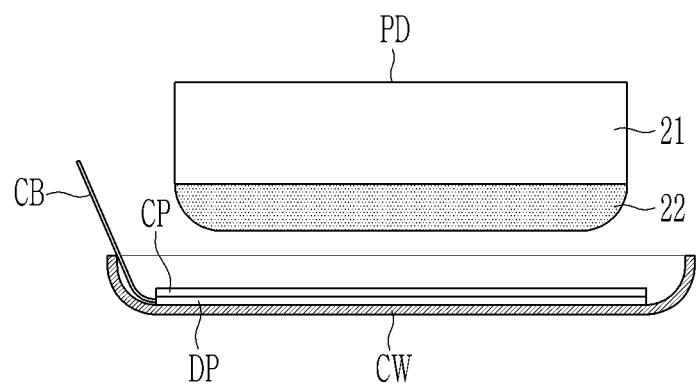

Referring to FIG. 8, the pressing pad PD may include a body portion 21 and an elastic portion 22. The body portion 21 may be made of a material that does not deform when pressed. For example, the material of the body portion 21 may include a metal such as aluminum or aluminum alloy. The elastic portion 22 may be made of an elastic material, and may be fixed or detachably attached to the body portion 21. The body portion 21 may be mounted to the pressing pad fixing part, and the elastic portion 22 may be in contact with the cover panel CP. When the pressing pad PD has a thick body portion 21 and a thin elastic portion 22, only the elastic portion 22 is deformed when pressed by the pressing pad PD, so that an amount of deformation of the pressing pad PD may be reduced. Therefore, it is possible to prevent interference between the pressing pad PD and the flexible printed circuit board CB and to prevent the flexible printed circuit board CB from being damaged. The thickness of the elastic portion 22 of the pressing pad PD may be about 0.5 mm to about 1.5 mm, for example, about 1 mm.

Figure 9:
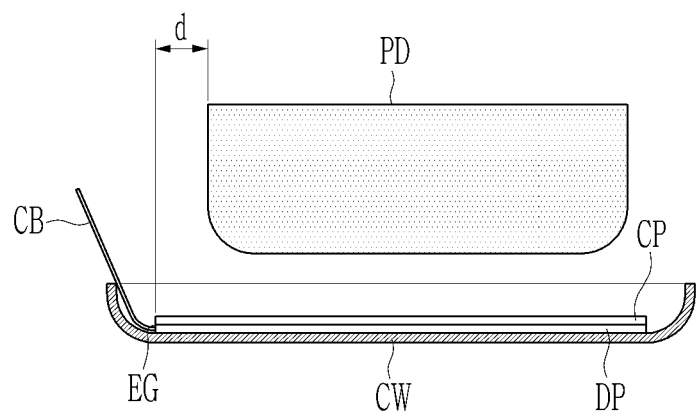
Figure 10:
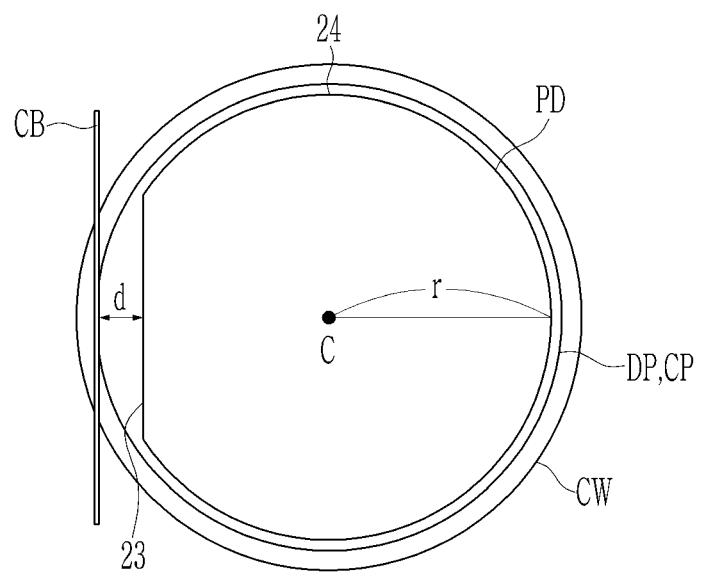

Referring to FIGS. 9 and 10, the pressing pad PD may be entirely made of an elastic material. The pressing pad PD may have a shape in which one side portion of a circular cylinder is vertically cut as a whole. For example, the pressing pad PD may have a first side surface (e.g., a flat side surface 23) and a second side surface (e.g., a circular side surface 24). For example, the pressing pad PD may have a cylinder shape including the flat side surface 23 and the circular side surface 24. For example, when the cover panel CP is attached to the display panel DP, the flat side surface 23 of the pressing pad PD may face the flexible printed circuit board CB. When the pressing pad PD is elastically deformed during pressing, in order that the pressing pad PD does not interfere with the flexible printed circuit board CB, the pressing pad PD may have a three-dimensional shape in which a portion of the pressing pad PD adjacent to the flexible printed circuit board CB is vertically cut (e.g., in the pressing direction). For example, the first side surface of the pressing pad PD may have a flat shape in which one side of the pressing pad PD is pressed toward a center C in an imaginary circle having a radius r. For example, the first side surface of the pressing pad PD adjacent to the flexible printed circuit board CB on the side surface of the pressing pad PD may be substantially flat. In another embodiment, the first side surface of the pressing pad PD may have a concave shape. In another embodiment, the first side surface of the pressing pad PD may have a convex shape having a radius of curvature greater than that of the circular side surface CS of the pressing pad PD. Before the pressing pad PD contacts the cover panel CP and then presses the cover panel CP (e.g., before the pressing pad PD is elastically deformed), the flat side surface 23 of the pressing pad PD may be spaced apart from the flexible printed circuit board CB, more accurately, from an edge EG of the display panel DP adjacent to the flexible printed circuit board CB, by a predetermined distance d, of about 0.5 mm or more, for example, about 1 mm to about 3 mm.

As described above, since the flat side surface 23 of the pressing pad PD is spaced apart from the flexible printed circuit board CB by the predetermined distance d, the pressing pad PD may not contact the flexible printed circuit board CB when the pressing pad PD is radially expanded by elastic deformation. In addition, it is possible to prevent the flexible printed circuit board CB from being damaged when the cover panel CP is attached to the display panel DP in a face-to-face manner by pressing the cover panel CP with the pressing pad PD.

Figure 11:
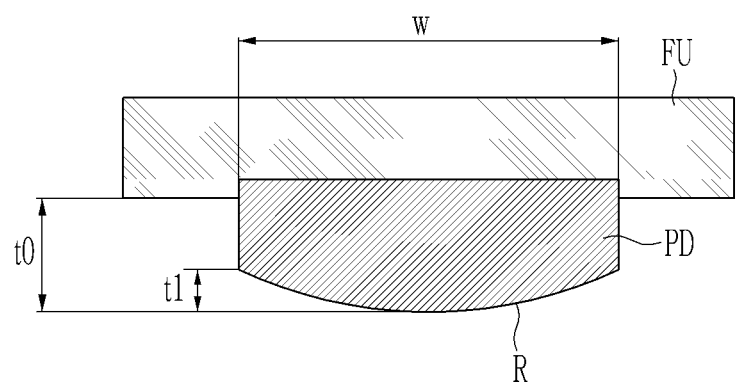
FIG. 11 is a schematic side view of an embodiment of a pressing pad used in the attachment process of the cover panel of FIGS. 7, 8, 9, and 10.

FIG. 11 schematically illustrates a pressing pad used in an attachment process of a cover panel according to an embodiment.

Referring to FIG. 11, the pressing pad PD may be fixed to a pressing pad fixing part FU such as a jig. As described above, in order to prevent air bubbles from being trapped at an attachment interface when the cover panel CP is attached, the pressing pad PD may have a convex lower surface. A central portion of the lower surface may be the most convex. The lower surface may be formed to have a radius of curvature R of, for example, about 50 mm to about 200 mm. Due to the convex shape of the lower surface of the pressing pad PD, the pressing pad PD may have a total thickness t0 including a thickness t1 of the convex portion. For example, the total thickness of the pressing pad PD may be a thickness of a portion of the pressing pad PD, which is protruded from the pressing pad fixing part FU. The total thickness t0 of the pressing pad PD may be about 5 mm to about 20 mm, for example, about 9 mm to about 18 mm, as described above. The thickness of the convex portion of the pressing pad PD may be about 1 mm to about 5 mm, for example, about 3 mm. The width w corresponding to a diameter of the pressing pad PD may be changed according to the size of the cover panel CP. For example, the width w may be about 30 mm to about 50 mm.

Figure 12:
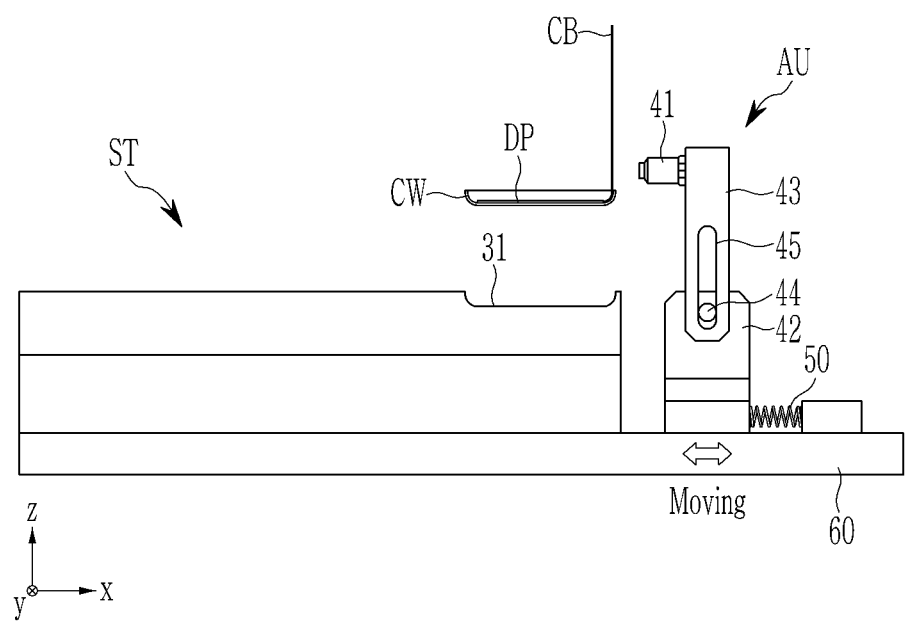
FIGS. 12 and 13 are schematic side views illustrating steps of mounting a display module on a stage in the attachment process of the cover panel of FIGS. 7, 8, 9, and 10 according to an embodiment.
Figure 13:
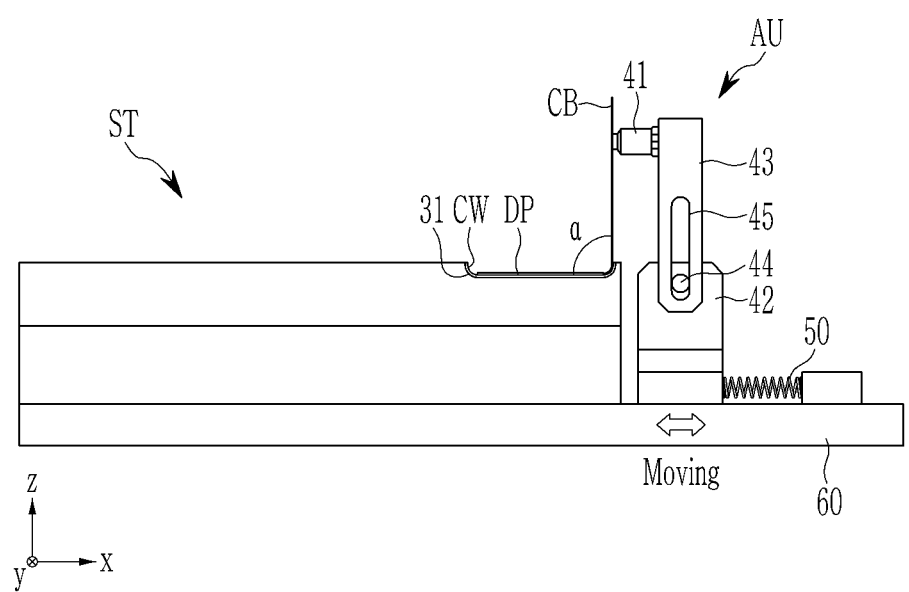

FIGS. 12 and 13 schematically illustrate steps of mounting a display module on a stage in a process of attaching a cover panel according to an embodiment.

A manufacturing apparatus shown in FIGS. 12 and 13 may be a manufacturing apparatus including the second transfer part TS2 for loading the display module inverted in the inversion part IV as described above to the alignment part AM. When the depth D of a concave portion of the cover window CW is large (for example, 3.5 mm or more) in a state that the display panel DP is attached to the display module, e.g., the cover window CW, the position and the movement of the flexible printed circuit board CB connected to the display panel DP may be restricted by the side portion SP of the cover window CW. The flexible printed circuit board CB may not be unfold in an outward direction of the cover window CW due to contact with the side portion SP, and may have a high angle (for example, about 80° or more) with respect to the front portion FP of the cover window CW. Accordingly, when the display module is transferred, for example, a crack may occur in the flexible printed circuit board CB as the flexible printed circuit board CB is tilted by the weight of the flexible printed circuit board CB, or when the cover panel CP is attached to the display panel DP, the cover panel CP may interfere with the flexible printed circuit board CB.

The manufacturing apparatus may include a stage ST. The stage ST may include a mounting portion 31 on which the display module is mounted. The mounting portion 31 may have a concave shape that is matched with a shape of the cover window CW. The mounting portion 31 may include openings for vacuum-adsorbing the display module.

The manufacturing apparatus may include an adsorption unit AU positioned at one side of the stage ST. The adsorption unit AU may include an adsorption head 41, a first support member 42, and a second support member 43. The adsorption head 41 may be coupled to the second support member 43. The adsorption head 41 may protrude from the second support member 43 towards the stage ST, and may include an opening for vacuum adsorption. The first support member 42 may be fixed to the pedestal 60. The second support member 43 may be coupled to the first support member 42 to be vertically movable. Accordingly, the adsorption head 41 may be positioned to adsorb the flexible printed circuit board CB at a height suitable for the length of the flexible printed circuit board CB. For movement of the second support member 43, for example, the first support member 42 may include a protrusion 44, and the second support member 43 may include a slit 45 in which the protrusion 44 may be inserted and formed long in a vertical direction (e.g., in the z direction). The adsorption unit AU may be mounted on the pedestal 60 to be movable in a horizontal direction (e.g., in the x direction) so that a distance from the stage ST may be adjusted. The manufacturing apparatus may include a driving unit 50 for moving the adsorption unit AU in a horizontal direction (e.g., in the x direction).

In the process of loading the display module on the stage ST, as shown in FIG. 12, the display module may be loaded on the mounting portion 31 in a state that the adsorption unit AU is moved back away from the stage ST. For example, the adsorption unit AU may move away from the stage ST before the display module is loaded on the mounting portion 31. When the adsorption unit AU is positioned close to the stage ST, the flexible printed circuit board CB and the adsorption head 41 may be interfered with each other when the display module is mounted. Thus, the adsorption unit AU may be reversely moved such that the flexible printed circuit board CB and the adsorption head 41 are not interfered with each other.

Referring to FIG. 13, after loading the display module on the mounting portion 31, the adsorption unit AU may be moved (e.g., in the negative x direction) to be close to the stage ST. Then, the flexible printed circuit board CB may be vacuum-adsorbed by the adsorption head 41 such that the flexible printed circuit board CB is supported and fixed. In this case, the cover window CW of the display module may be vacuum-adsorbed by the mounting portion 31. The distance between the stage ST and the adsorption unit AU (e.g., the adsorption head 41) may be adjusted to form a predetermined angle in a state that the flexible printed circuit board CB is vacuum adsorbed. The angle α between the flexible printed circuit board CB and the front portion FP of the cover window CW may be about 90° or more, or about 90° to about 100°, for example, about 91.5°, but embodiments are not limited thereto.

As described above, in a state that the display module is loaded on the stage ST and the flexible printed circuit board CB is adsorbed and supported by the adsorption unit AU, the display module may be transferred to, for example, the alignment part AM and the attachment part AP described above, and the alignment process and the attachment process may be performed. Since the display module may be transferred in a state that the flexible printed circuit board CB maintains a predetermined angle and the cover panel CP may be aligned and attached to the display module, it is possible to prevent the flexible printed circuit board CB from being damaged, or to prevent the flexible printed circuit board CB from interfering with the cover panel CP when the cover panel CP is attached.

Figure 14:
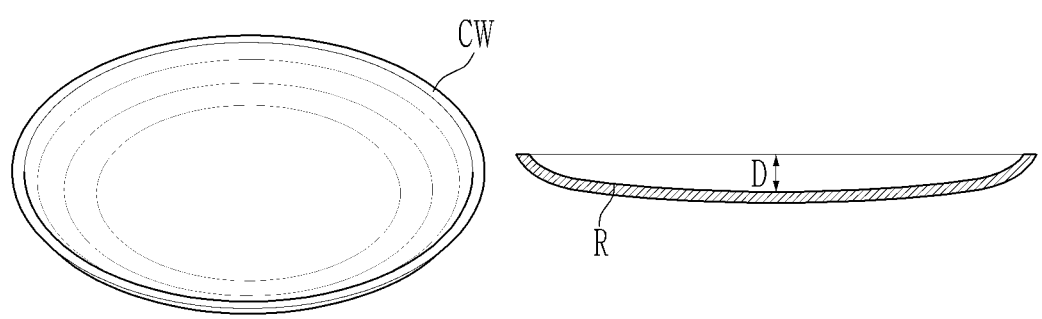
FIG. 14 is a schematic perspective view and a schematic cross-sectional view of an embodiment of a cover window.

FIG. 14 schematically illustrates a cover window according to an embodiment.

The drawing at the left side of FIG. 14 is a rear perspective view thereof, and the drawing at the right side of FIG. 14 is a cross-sectional view thereof. Referring to FIG. 14, the cover window CW may have a dome shape. For example, the cover window CW may have a curved surface having a predetermined radius of curvature R over front and side portions FP and SP of the cover window CW. Due to the dome shape of the cover window CW, the cover window CW may include a concave portion having a predetermined depth D. For attaching the cover panel CP to the display panel DP positioned in the concave portion, as in the above-described embodiment, the alignment and temporary attachment performed by using the peeling head HD and the face-to-face attachment performed by using the pressing pad PD may be applied.

Figure 15:
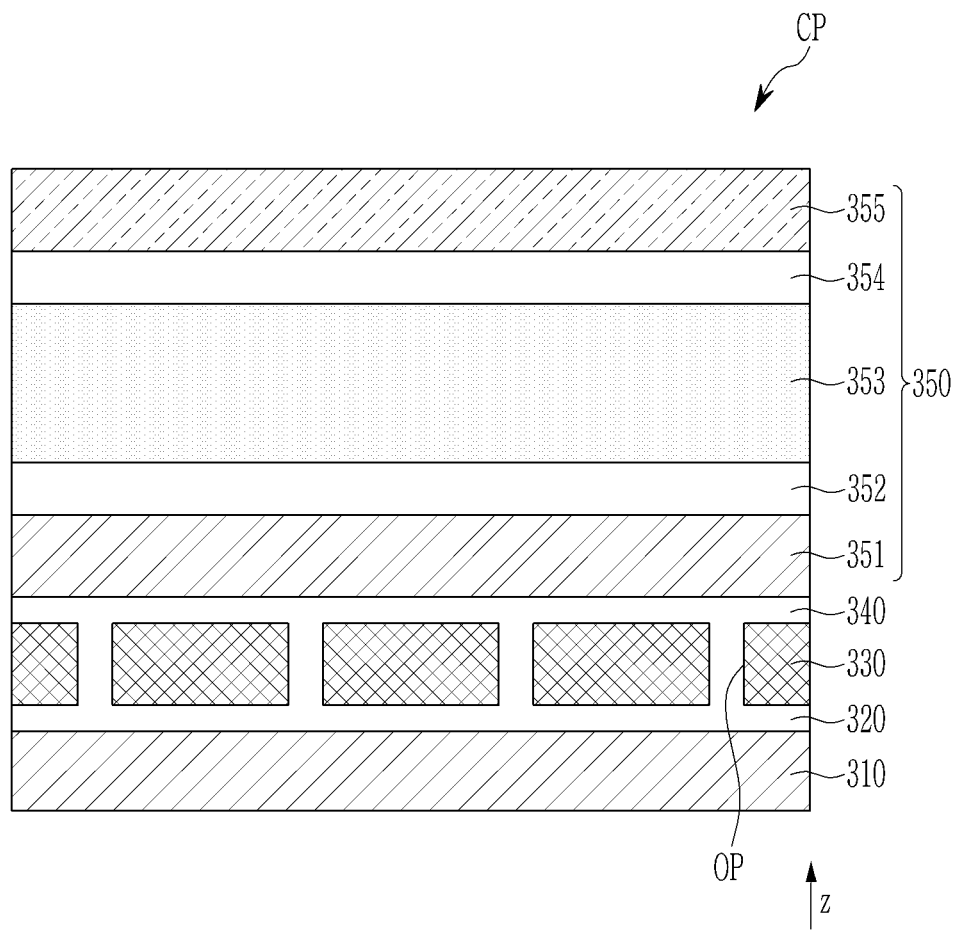
FIG. 15 is a schematic cross-sectional view of an embodiment of a cover panel.

FIG. 15 illustrates a schematic cross-sectional view of a cover panel according to an embodiment.

FIG. 15 illustrates a cross-sectional structure of the cover panel CP that may be included in the display device 100. Referring to FIG. 15, the cover panel CP may have a structure in which a plurality of layers are stacked. The cover panel CP may include a shielding layer 310, a heat dissipation member 330, and an impact absorption layer 350. Adhesive layers 320 and 340 may be disposed between respective layers to attach them to each other.

The shielding layer 310 may prevent electromagnetic waves, static electricity, noise, and the like from flowing from the rear surface of the cover panel CP toward the display panel DP. The shielding layer 310 may improve a heat dissipation characteristic of the heat dissipation member 330. The shielding layer 310 may be a metal layer including a metal (e.g., copper or aluminum) having excellent thermal conductivity as well as shielding performance.

The heat dissipation member 330 may dissipate heat generated from heat generating elements such as a processor, a battery, and the like. The heat dissipation member 330 may include a material having excellent thermal conductivity. The heat dissipation member 330 may include a carbon material such as graphite, graphene, or carbon nanotubes.

The heat dissipation member 330 may include openings OP passing through in a thickness direction (e.g., in the z direction). The adhesive layer 320 and/or the adhesive layer 340 may be introduced into the opening OP of the heat dissipation member 330 to improve bonding force between the heat dissipation member 330 and the shielding layer 310 and/or the impact absorption layer 350, and to prevent the heat dissipation member 330 from being peeled off. The adhesive layers 320 and 340 may be formed of a thermosetting adhesive.

The impact absorption layer 350 may include a first support layer 351, a cushion layer 353, and a second support layer 355. The first and second support layers 351 and 355 may be plastic layers made of a polymer such as polyimide (PI) or polyethylene terephthalate (PET). The first and second support layers 351 and 355 may bond the cushion layer 353 disposed therebetween to another layer or member. The cushion layer 353 may absorb impact to prevent the display panel DP from being damaged. The cushion layer 353 may be a porous layer made of a material such as polyurethane or polyethylene. The cushion layer 353 may include a foam resin. The cushion layer 353 may include an elastomer. Between the first support layer 351 and the cushion layer 353 and between the cushion layer 353 and the second support layer 355, adhesive layers 352 and 354 for attaching the first support layer 351, the cushion layer 353, and the second support layer 355 may be disposed. A pressure-sensitive adhesive (PSA) may be used to form the adhesive layers 352 and 354.

Hereinafter, a configuration of a display panel DP that may be included in a display device according to an embodiment will be described with reference to FIG. 16.

Figure 16:
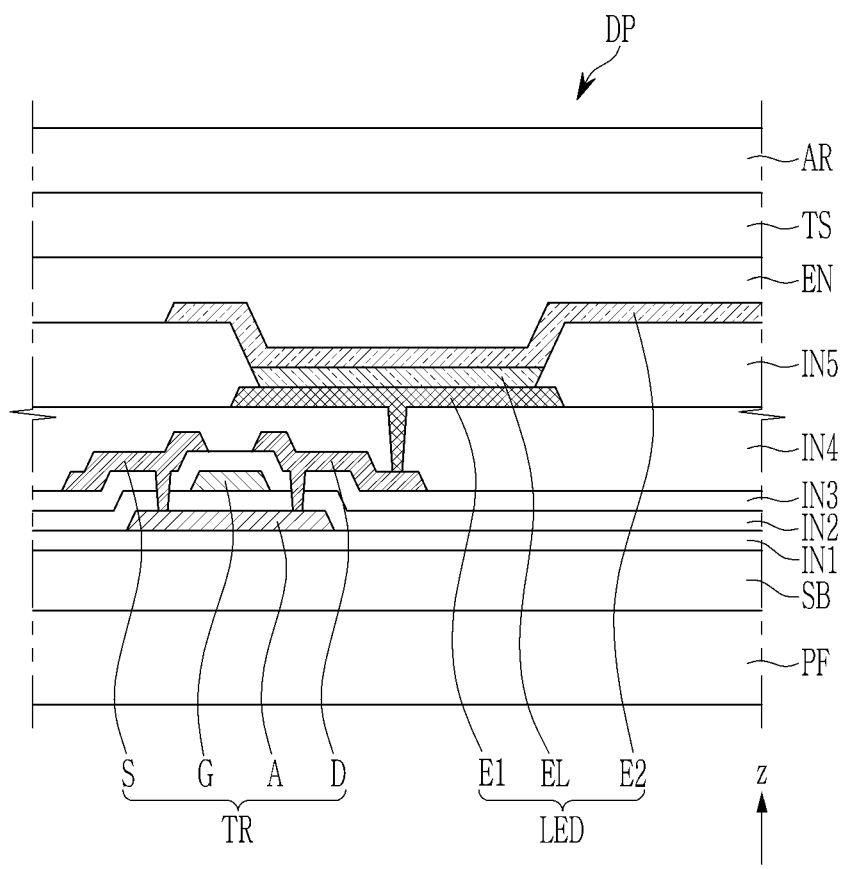
FIG. 16 is a schematic cross-sectional view of an embodiment of a display panel.

FIG. 16 illustrates a schematic cross-sectional view of a display panel according to an embodiment.

FIG. 16 illustrates a cross-sectional view of an example of a stacked structure of the display panel DP according to an embodiment. The cross-section shown in FIG. 16 may substantially correspond to one pixel area.

The display panel DP may include a substrate SB, a transistor TR formed on the substrate SB, and a light emitting diode LED connected to the transistor TR.

The substrate SB may be a flexible substrate including a polymer such as polyimide, polyamide, or polyethylene terephthalate. The substrate SB may include a barrier layer that prevents moisture, oxygen, and the like from penetrating. For example, the substrate SB may include one or more polymer layers and one or more barrier layers, and the polymer layers and the barrier layers may be alternately stacked. The substrate SB may be a glass substrate.

An insulating layer IN1 may be disposed on the substrate SB. The insulating layer IN1 may be referred to as a buffer layer, and it may block impurities permeated from the substrate SB during formation of a semiconductor layer A to improve characteristics of the semiconductor layer A, and may flatten a surface of the substrate SB to relieve stress of the semiconductor layer A. The barrier layer and the first insulating layer IN1 may include an inorganic insulating material such as a silicon nitride ($SiN_x$), a silicon oxide ($SiO_x$), or a silicon oxynitride ($SiO_xN_y$).

A semiconductor layer A of the transistor TR may be disposed on the insulating layer IN1. The semiconductor layer A may include a first area, a second area, and a channel area between the areas. The semiconductor layer A may include a semiconductor material such as polysilicon, an oxide semiconductor, or amorphous silicon.

An insulating layer IN2 may be disposed on the semiconductor layer A. The insulating layer IN2 may be referred to as a gate insulating layer, and may include an inorganic insulating material.

A gate conductive layer including a gate electrode G of the transistor TR may be disposed on the insulating layer IN2. The gate conductive layer may include a metal such as molybdenum (Mo), aluminum (Al), copper (Cu), or titanium (Ti).

An insulating layer IN3 may be disposed on the gate conductive layer. The insulating layer IN3 may be referred to as an interlayer insulating layer, and may include an inorganic insulating material.

A data conductive layer including a first electrode S and a second electrode D of the transistor TR may be disposed on the insulating layer IN3. The first electrode S and the second electrode D may be respectively connected to the first area and the second area of the semiconductor layer A through contact holes formed in the insulating layers IN2 and IN3. The data conductive layer may include a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni).

An insulating layer IN4 may be disposed on the data conductive layer. The insulating layer IN4 may be referred to as a planarization layer. The insulating layer IN4 may include an organic insulating material such as general-purpose polymers such as polymethyl methacrylate and polystyrene, a polymer derivative having a phenolic-based group, an acryl-based polymer, an imide-based polymer, polyimide, or a siloxane-based polymer.

A pixel electrode E1 may be disposed on the insulating layer IN4. The pixel electrode E1 may be connected to the second electrode D through a contact hole formed in the fourth insulating layer IN4.

An insulating layer IN5 may be disposed on the insulating layer IN4. The insulating layer IN5 may be referred to as a pixel defining layer. The insulating layer IN5 may have an opening overlapping the pixel electrode E1. The insulating layer IN5 may include an organic insulating material.

An emission layer EL may be disposed on the pixel electrode E1, and a common electrode E2 may be disposed on the emission layer EL. At least one of a hole injection layer, a hole transporting layer, an electron transporting layer, and an electron injection layer may be disposed between the pixel electrode E1 and the common electrode E2 in addition to the emission layer EL.

The pixel electrode E1, the emission layer EL, and the common electrode E2 may form a light emitting diode LED. The pixel electrode E1 may be an anode of the light emitting diode LED, and the common electrode E2 may be a cathode of the light emitting diode LED.

An encapsulation layer EN may be disposed on the common electrode E2. The encapsulation layer EN may encapsulate the light emitting diode LED to prevent moisture or oxygen from penetrating from the outside. The encapsulation layer EN may be a thin film encapsulation layer including one or more inorganic layers and one or more organic layers. For example, the encapsulation layer EN may have a triple-layered structure of an inorganic layer/an organic layer/an inorganic layer.

A touch sensor layer TS may be disposed on the encapsulation layer EN. The touch sensor layer TS may include a touch electrode layer and an insulating layer, and the touch electrode layer may have a mesh shape. The touch electrode layer may include a metal such as aluminum (Al), copper (Cu), titanium (Ti), molybdenum (Mo), silver (Ag), chromium (Cr), or nickel (Ni).

An anti-reflective layer AR for reducing reflection of external light may be disposed on the touch sensor layer TS. The anti-reflective layer AR may be a combination of a light blocking layer and a color filter, or may include a polarization layer.

A protective film PF to protect the display panel DP may be disposed under the substrate SB. The protective film PF may include a polymer such as polyethylene terephthalate, polyethylene naphthalate, or polyimide.

Referring to FIG. 2 together, the cover window CW and the cover panel CP may be respectively attached to the upper and lower surfaces of the display panel DP by the adhesive layer AH.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An apparatus for manufacturing a display device, the apparatus defining a horizontal direction and a vertical direction orthogonal to the horizontal direction, the apparatus comprising:
    a stage for supporting a display module comprising a display panel, a cover window, and a flexible printed circuit board;
    an adsorption unit disposed at one side of the stage in the horizontal direction, the adsorption unit configured to be moved in the horizontal direction such that a distance between the stage and the adsorption unit is adjusted; and
    a driving unit for causing the adsorption unit to be moved back and forth in the horizontal direction, wherein the adsorption unit is configured to hold the flexible printed circuit board connected to the display panel, wherein the cover window comprises a front portion that is planar and orthogonal to the vertical direction and a side portion, and wherein the adsorption unit is configured to adsorb and support the flexible printed circuit board such that an angle between the flexible printed circuit board and the front portion of the cover window is 90° or more and the flexible printed circuit board does not overlap the front portion in the vertical direction.

2. The apparatus for manufacturing the display device of claim 1, wherein the adsorption unit is configured to move away from the stage before the display module is loaded on the stage, and to move closer to the stage to adsorb and support the flexible printed circuit board after the display module is loaded on the stage.

3. The apparatus for manufacturing the display device of claim 1, wherein the adsorption unit comprises an adsorption head configured to vacuum-adsorb the flexible printed circuit board and a support member for supporting the adsorption head, and wherein the adsorption head protrudes from the support member toward the stage.

4. The apparatus for manufacturing the display device of claim 3, wherein:

the support member comprises a first support member and a second support member coupled to the first support member to be vertically movable, and the adsorption head is coupled to the second support member.

5. The apparatus for manufacturing the display device of claim 1, further comprising a peeling head configured to adsorb a cover panel for alignment of the cover panel with respect to the display panel, wherein the peeling head comprises a first portion having a first diameter and a second portion protruding from the first portion, the second portion of the peeling head having a second diameter smaller than the first diameter of the first portion of the peeling head.

6. The apparatus for manufacturing the display device of claim 5, wherein the peeling head further comprises an adsorption pad coupled to the second portion of the peeling head, the adsorption pad comprising an opening for vacuum adsorption of the cover panel, wherein the peeling head forms a T-shaped structure with respect to a cross-sectional view of the peeling head, with the second portion disposed between the adsorption pad and the first portion.

7. The apparatus for manufacturing the display device of claim 5, wherein the first portion and the second portion of the peeling head are integrally formed.

8. The apparatus for manufacturing the display device of claim 1, further comprising a pressing pad configured to attach a cover panel to the display panel in a face-to-face manner, wherein the pressing pad comprises a body portion, and an elastic portion coupled to the body portion, the elastic portion having a thickness smaller than that of the body portion.

9. The apparatus for manufacturing the display device of claim 1, further comprising a pressing pad configured to attach a cover panel to the display panel in a face-to-face manner, wherein the pressing pad has a cylinder shape having a flat side surface and a circular side surface.

10. The apparatus for manufacturing the display device of claim 9, wherein when the cover panel is attached to the display panel, the flat side surface of the pressing pad faces the flexible printed circuit board.

11. The apparatus for manufacturing the display device of claim 10, wherein before the pressing pad presses the cover panel, a distance between an edge of the display panel adjacent to the flexible printed circuit board and the flat side surface of the pressing pad is about 0.5 mm or more.

12. A method for manufacturing a display device via an apparatus defining a horizontal direction and a vertical direction orthogonal to the horizontal direction, the apparatus, the method comprising:

reversely moving an adsorption unit disposed at one side of a stage in the horizontal direction to be away from the stage;

loading a display module into a mounting portion of the stage, the display module comprising a display panel, a cover window, and a flexible printed circuit board;

moving the adsorption unit in the horizontal direction via a driving unit that causes the adsorption unit to be moved back and forth in the horizontal direction such that a distance between the stage and the adsorption unit is adjusted, the adsorption unit being moved such that the adsorption unit is closer to the stage; and adsorbing and supporting the flexible printed circuit board connected to the display panel by the adsorption unit such that the adsorption unit holds the flexible printed circuit board connected to the display panel, wherein the cover window comprises a front portion that is planar and orthogonal to the vertical direction and a side portion, and wherein the adsorption unit adsorbs and supports the flexible printed circuit board such that an angle between the flexible printed circuit board and the front portion of the cover window is 90° or more and the flexible printed circuit board does not overlap the front portion in the vertical direction.

13. The method for manufacturing the display device of claim 12, further comprising the step of aligning a cover panel with respect to the display panel in a state that the flexible printed circuit board is adsorbed and supported by the adsorption unit.

14. The method for manufacturing the display device of claim 13, further comprising the step of contacting a portion of the cover panel to the display panel when the cover panel is aligned to the display panel.

15. The method for manufacturing the display device of claim 13, wherein the step of aligning of the cover panel is performed by using a peeling head, and the peeling head comprises a first portion, a second portion protruding from the first portion, and an adsorption pad coupled to the second portion, and wherein the first portion of the peeling head has a diameter greater than that of the second portion of the peeling head.

16. The method for manufacturing the display device of claim 13, further comprising
the step of attaching the cover panel to the display panel in a state that the flexible printed circuit board is adsorbed and supported by the adsorption unit.

17. The method for manufacturing the display device of claim 16, wherein
the cover panel is attached to the display panel in a face-to-face manner by using a pressing pad.

18. The method for manufacturing the display device of claim 12, wherein
the cover window is adsorbed and supported by the mounting portion of the stage when the flexible printed circuit board is adsorbed and supported by the adsorption unit.

* * * * *